(12) United States Patent
Bianchi

(10) Patent No.: US 9,209,772 B2
(45) Date of Patent: Dec. 8, 2015

(54) ELECTRICAL FILTER STRUCTURE

(75) Inventor: Giovanni Bianchi, Nufringen (DE)

(73) Assignee: ADVANTEST CORPORATION, Tokyo (JP)

( * ) Notice: Subject to any disclaimer, the term of this patent is extended or adjusted under 35 U.S.C. 154(b) by 168 days.

(21) Appl. No.: 13/700,727

(22) PCT Filed: May 28, 2010

(86) PCT No.: PCT/EP2010/057500
§ 371 (c)(1),
(2), (4) Date: Feb. 6, 2013

(87) PCT Pub. No.: WO2011/147469
PCT Pub. Date: Dec. 1, 2011

(65) Prior Publication Data
US 2013/0249650 A1    Sep. 26, 2013

(30) Foreign Application Priority Data

May 28, 2010  (EP) .................................. 2010/057500

(51) Int. Cl.
| H01P 3/08 | (2006.01) |
| H03H 7/38 | (2006.01) |
| H03H 7/01 | (2006.01) |
| H01P 1/203 | (2006.01) |

(52) U.S. Cl.
CPC .............. *H03H 7/38* (2013.01); *H01P 1/2039* (2013.01); *H03H 7/0123* (2013.01)

(58) Field of Classification Search
USPC ......... 333/204, 205, 202, 168, 175, 176, 185, 333/32, 33, 219, 235
See application file for complete search history.

(56) References Cited

U.S. PATENT DOCUMENTS

| 2,192,991 | A | * | 3/1940 | Wheeler ...................... 333/178 |
| 6,097,260 | A |   | 8/2000 | Whybrew et al. |
| 6,191,666 | B1 | * | 2/2001 | Sheen ........................... 333/185 |
| 6,426,683 | B1 | * | 7/2002 | Gu et al. ....................... 333/174 |
| 6,825,818 | B2 | * | 11/2004 | Toncich ........................ 343/860 |
| 7,027,314 | B2 | * | 4/2006 | Soto et al. ...................... 363/39 |
| 2002/0130737 | A1 | | 9/2002 | Hreish et al. |
| 2005/0231304 | A1 | | 10/2005 | White et al. |
| 2007/0139138 | A1 | * | 6/2007 | Chen ............................ 333/175 |
| 2009/0033439 | A1 | | 2/2009 | Igarashi |

FOREIGN PATENT DOCUMENTS

| EP | 1933411 | 6/2008 |
| FR | 2828582 | 2/2003 |

* cited by examiner

*Primary Examiner* — Lincoln Donovan
*Assistant Examiner* — Thomas Skibinski

(57) ABSTRACT

An electrical filter structure for forwarding an electrical signal from a first filter port to a second filter port in a frequency-selective manner includes a filter core structure having a working impedance, wherein the working impedance is different from a first characteristic port impedance of a first filter port, and also different from a second characteristic port impedance of a second filter port. The electrical filter structure also includes a first matching arrangement electrically coupled between the first filter port and the filter core structure and a second matching arrangement electrically coupled between the second filter port and the filter core structure.

18 Claims, 10 Drawing Sheets

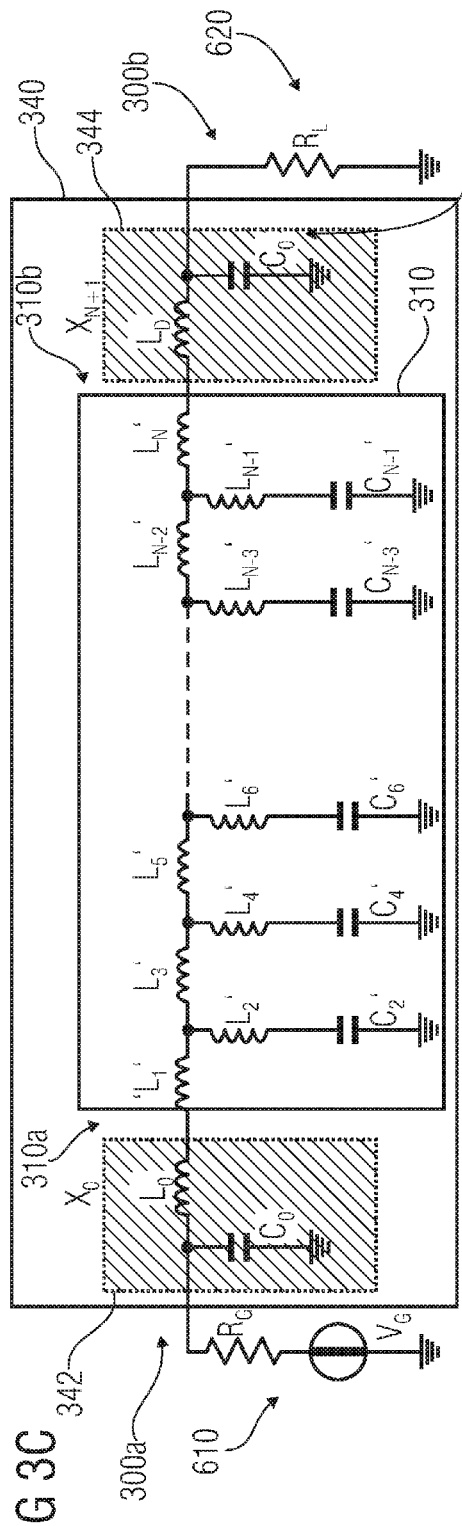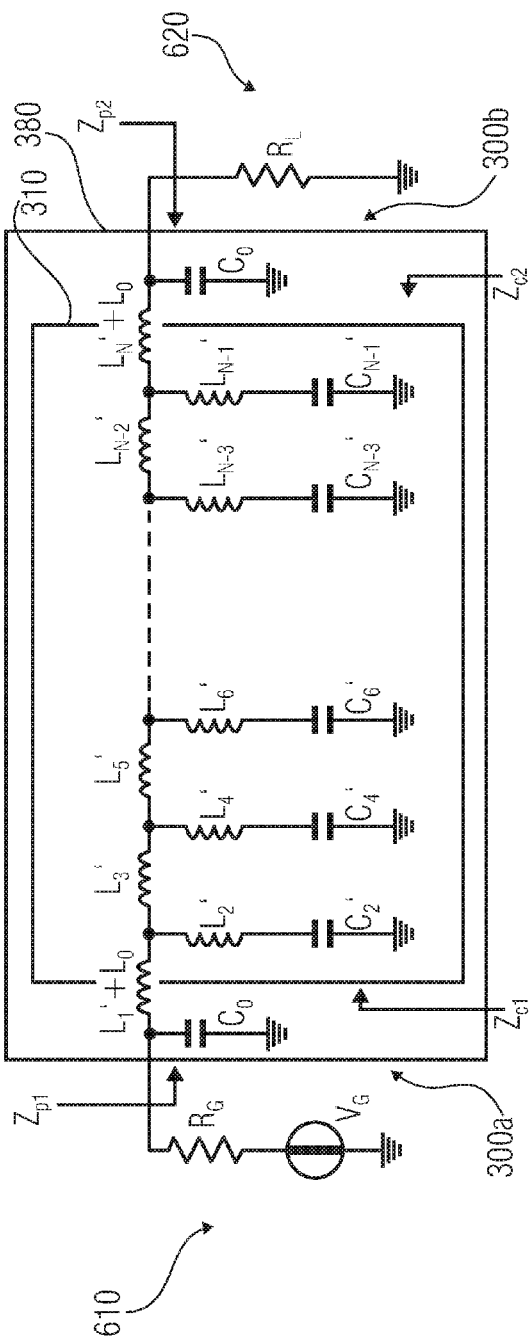
FIG 3C
FIG 3D

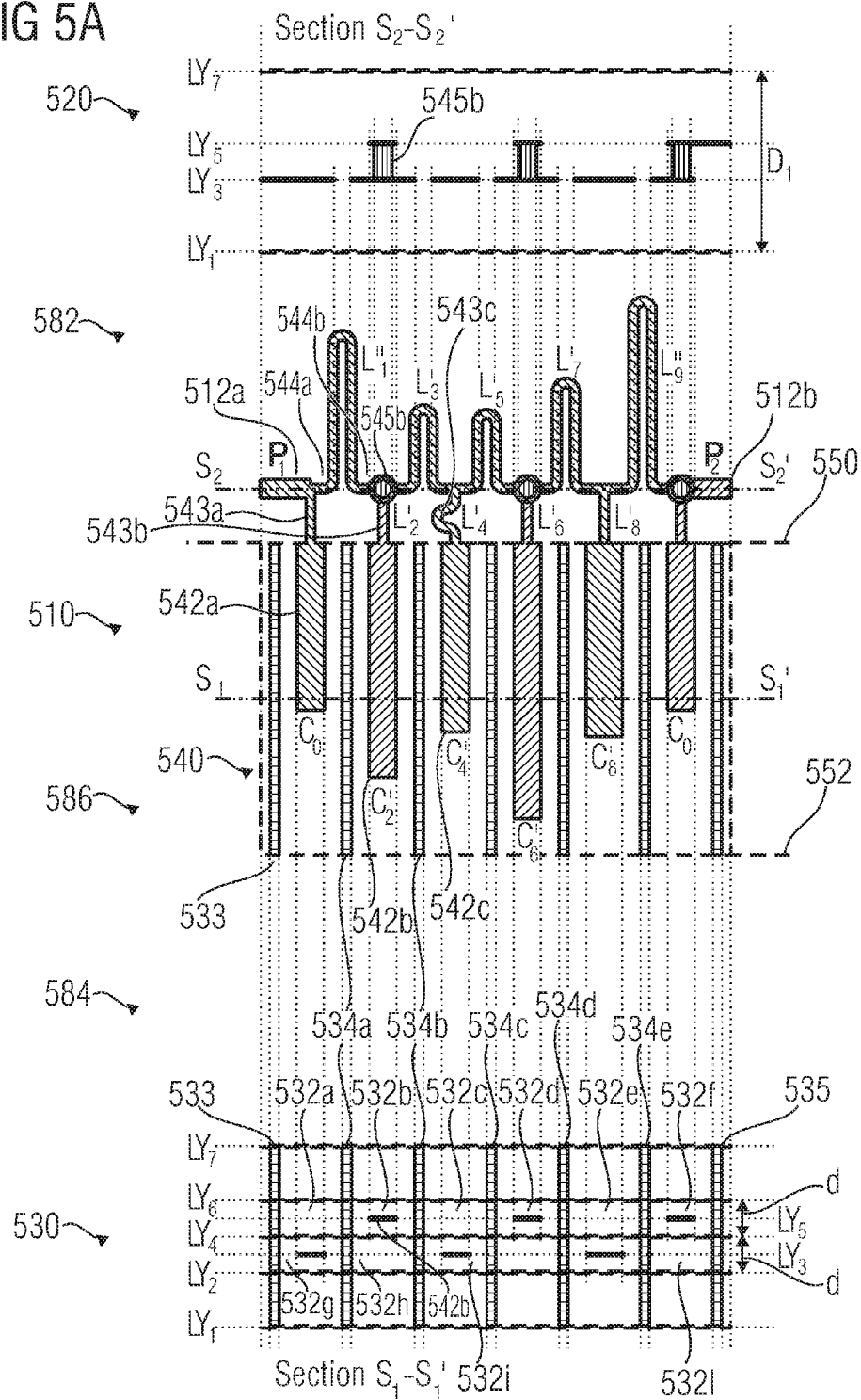

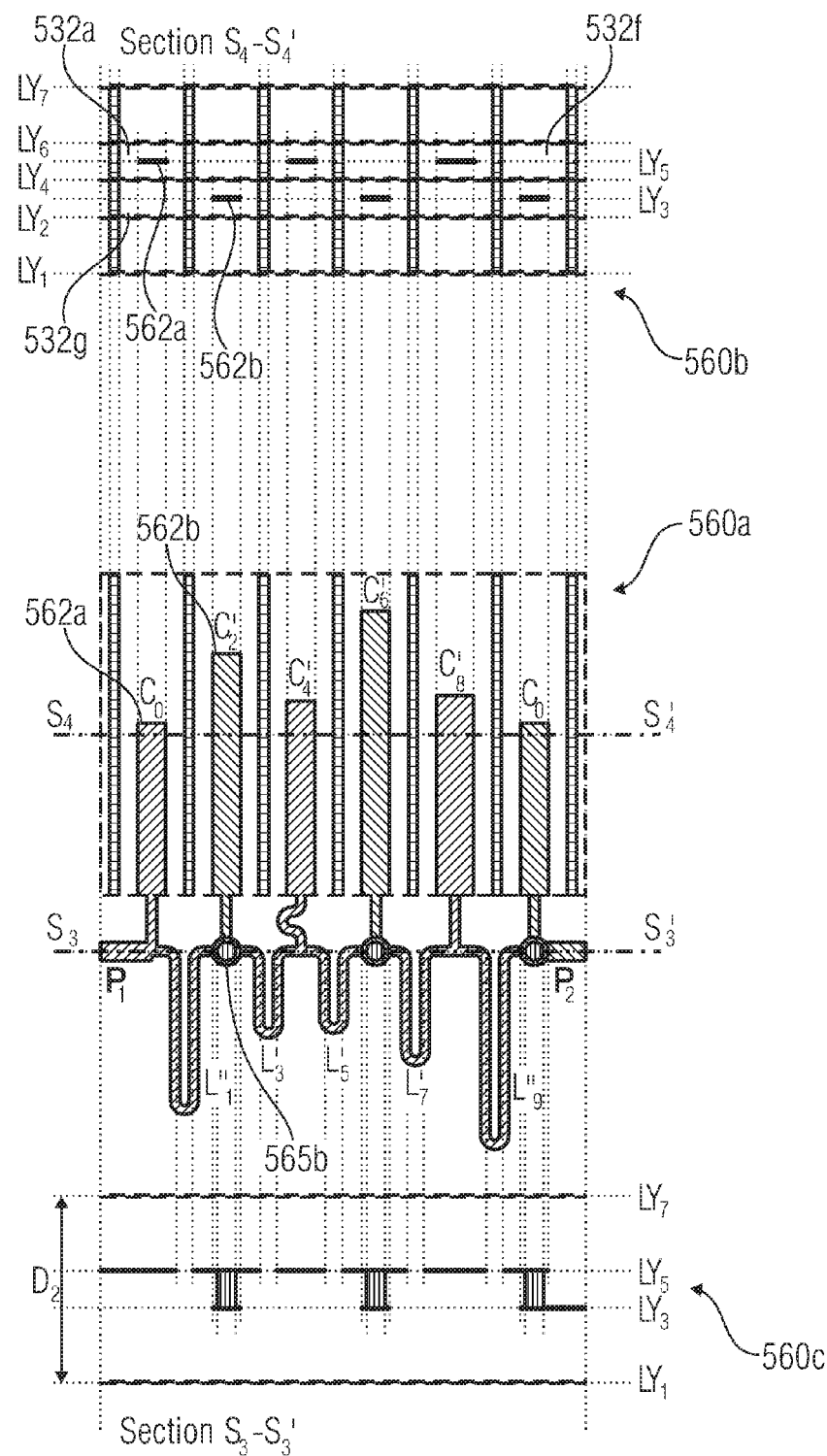

ELECTRICAL FILTER STRUCTURE

CROSS-REFERENCE TO RELATED APPLICATIONS

This application is a Continuation of and claims priority to International Application No. PCT/EP2010/057500, filed on May 28, 2010, titled "ELECTRICAL FILTER STRUCTURE," by Giovanni Bianchi, which is herein incorporated by reference.

FIELD OF THE INVENTION

Embodiments according to the invention are related to an electrical filter structure for forwarding an electrical signal from a first filter port to a second filter port in a frequency-selective manner. Some embodiments according to the invention are related to a scaled impedance semi-lumped low-pass filter.

BACKGROUND OF THE INVENTION

Electrical filter structures are used in many applications. For example, electrical filter structures may be implemented to act as a low-pass filter, as a bandpass filter or as a high-pass filter. In the following, a brief introduction will be given to the design of filters.

FIG. 6a shows a schematic of a conventional lumped N-order low-pass filter (also briefly designated with LPF). The filter 600 is placed between a source 610 (modeled by a voltage source having a generator voltage $V_G$ and a resistance having a generator resistance $R_G$) and a load 620 (modeled by a resistor having an impedance $R_L$). Usually, the internal impedance (modeled here by the resistor having the generator resistance $R_G$) and the load impedance (modeled by the resistor having the load resistance $R_L$) are purely resistive. This justifies why FIGS. 6a and 6b represent them as resistors $R_G$ and $R_L$. Moreover, the load impedance $R_L$ and the source impedance $R_G$ are typically coincident (the only relevant exception is the even-order Chebyshev filter) and equal to 50Ω in most cases.

The filter 600 itself consists of floor(N/2) series inductors $L_1, L_3, \ldots, L_N$ and ceil(N/2) shunt series LC cells $L_2$-$C_2$, $L_4$-$C_4, \ldots, L_{N-1}$-$C_{N-1}$. By definition, given a real number x, the function floor(x) returns the smallest integer greater or equal to x, while the function ceil(x) returns the greatest integer smaller or equal to x. More precisely, the inductors of the above mentioned shunt cells are short-circuited in all-poles types of filters, such as Butterworth, Chebyshev, and Bessel.

FIG. 6b shows a schematic of a so-called semi-lumped realization of the (low-pass) filter of FIG. 6a: all the inductors are realized with transmission line segments (also designated as transmission line portions) having (comparatively) high characteristic impedance, and all capacitors are realized with transmission line segments (also designated as transmission line portions) having (comparatively) low characteristic impedance. Herein, the qualifications "high" and "low" denote values which are much greater and much smaller (for example, by a factor of at least 1.5 greater or smaller, but advantageously by a factor of at least two or even and least 3 greater or smaller) than the working impedance (also designated as "internal impedance") of the filter.

However, it has been found that the implementation of the filter structure 600a according to FIG. 6b with good filter characteristics is problematic in some technologies. For example, it has been found that it is sometimes difficult to obtain good broadband characteristics in a real implementation of the filter structure 600a.

Accordingly, it is an objective of the present invention to create embodiments of the present invention which facilitate the implementation of a desired filter characteristic using a readily available technology.

SUMMARY

According to an embodiment, an electrical filter structure for forwarding an electrical signal from a first filter port to a second filter port in a frequency-selective manner may have: a first filter port having a first characteristic port impedance; a second filter port having a second characteristic port impedance; a filter core structure having a working impedance, wherein the working impedance is different from the first characteristic port impedance and from the second characteristic port impedance; a first matching arrangement circuited between the first filter port and the filter core structure, wherein the first matching arrangement is configured to perform an impedance matching between the first characteristic port impedance and a characteristic impedance presented by the filter core structure to the first matching arrangement; and a second matching arrangement circuited between the second filter port and the filter core structure, wherein the second matching arrangement is configured to perform an impedance matching between the second characteristic port impedance and a characteristic impedance presented by the filter core structure to the second matching arrangement; wherein the working impedance of the filter core structure is smaller than the first characteristic port impedance, and wherein the working impedance of the filter core structure is smaller than the second characteristic port impedance; wherein the filter core structure comprises a plurality of inductances which are implemented using transmission lines having transmission line impedances which are higher than the working impedance; and wherein the filter core structure comprises a plurality of capacitances which are implemented using transmission lines having transmission line impedances which are smaller than the working impedance.

According to another embodiment, a double filter structure may have: a first filter structure according to the above described electrical filter structure; and a second filter structure according to the above described electrical filter structure; wherein the first filter structure comprises a first filter core structure; wherein the second filter structure comprises a second filter core structure; wherein the first filter core structure comprises a first filter core structure port, a second filter core structure port, a plurality of series impedance elements circuited between the first filter core structure port and the second filter core structure port, and a plurality of shunt impedance elements, wherein the shunt impedance elements of the first filter core structure are implemented using transmission line structures coupled to nodes which are electrically between subsequent series impedance elements of the first filter core structure; and wherein the second filter core structure comprises a third filter core structure port, a fourth filter core structure port, a plurality of series impedance elements circuited between the third filter core structure port and the fourth filter core structure port, and a plurality of shunt impedance elements, wherein the shunt impedance elements of the second filter core structure are implemented using transmission line structures coupled to nodes which are electrically between subsequent series impedance elements of the second filter core structure; wherein the shunt impedance elements of the first filter core structure are arranged in different conducting layers of a multi-layer structure, and wherein the shunt impedance elements of the second filter core structure are arranged in different conducting layers of the multi-layer structure, and wherein a transmission line structure used to implement a first shunt impedance element of the first filter core structure and a transmission line structure used to implement a second shunt impedance element of the second filter core structure are arranged in the same conducting layer of the multi-layer structure, and wherein a transmission line structure used to implement a second shunt impedance element of the first filter core structure and a transmission line structure used to implement a first shunt impedance element of the second filter core structure are arranged in the same conducting layer of the multi-layer structure, and wherein the transmission line structure used to implement the first shunt impedance element of the first filter core structure and the transmission line structure used to implement the first shunt impedance element of the second filter core structure are at least partly overlapping in a projection perpendicular to a main surface of the multi-layer structure, with a conductive shielding in between, and wherein the transmission line structure used to implement the second shunt impedance element of the second filter core structure and the transmission line structure used to implement the second shunt impedance element of the first filter core structure are at least partly overlapping in a projection perpendicular to the main surface of the multi-layer structure, with a conductive shielding in between.

An embodiment according to the invention creates an electrical filter structure for forwarding an electrical signal from a first filter port to a second filter port in a frequency-selective manner. The filter comprises a first filter port having a first characteristic port impedance and a second filter port having a second characteristic port impedance. The filter structure also comprises a filter core structure having a working impedance, wherein the working impedance is different from the first characteristic port impedance and the second characteristic port impedance. The filter structure also comprises a first matching arrangement circuited between the filter port and the filter core structure, wherein the first matching arrangement is configured to perform an impedance matching between the first characteristic port impedance and a characteristic impedance presented by the filter core structure to the first matching arrangement. The filter structure also comprises a second matching arrangement circuited between the second filter port and the filter core structure, wherein the second matching arrangement is configured to perform an impedance matching between the second characteristic port impedance and a characteristic impedance presented by the filter core structure to the second matching arrangement.

It has been found that the introduction of matching arrangements at the input (first filter port) and at the output (second filter port) of the filter structure allows to choose the working impedance (also designated as "internal impedance") of the filter core structure different from the (external) characteristic port impedances. Accordingly, it is, for example, possible to use a filter core structure having an impedance different from 50Ω in a 50Ω environment, wherein a transmission line connected to the input of the filter (e.g., to the first filter port) comprises a transmission line impedance of 50Ω and wherein a transmission line connected to the output of the filter (e.g., to the second filter port) comprises a transmission line impedance of 50 Ωn. It has been found that a flexible choice of the working impedance of the filter core structure allows to adapt the actual implementation of the filter core structure to the available technology, which in turn allows to use impedance elements which are available in the implementation technology with good electrical characteristics. Accordingly, it is possible to obtain an overall filter structure, which is well-adapted to the available technology and therefore often provides better characteristics than a filter structure having a filter core structure with a working impedance which is identical to the characteristic port impedances. In other words, it has been found that the benefit, which is caused by the usage of an ideally suited filter core working impedance, outweighs the disadvantages caused by the need to use the matching arrangements.

In an advantageous embodiment, the working impedance of the filter core structure is smaller than the first characteristic port impedance, and the working impedance of the filter core structure is also smaller than the second characteristic port impedance. It has been found that it is often advantageous to have a filter core structure with a comparatively small working impedance, because it is difficult to fabricate transmission lines having a transmission line impedance which is significantly higher than the characteristic port impedances (wherein the characteristic port impedances are often chosen to allow for an advantageous implementation of transmission lines having the port impedance as their transmission line impedances). Accordingly, the choice of a low working impedance for the filter core structure facilitates the implementation of the filter core structure as a semi-lumped filter, in which inductances are implemented using transmission line portions, the transmission line impedance of which is higher (advantageously by a factor of at least 1.5, or even at least 2) than the working impedance of the filter.

In an advantageous embodiment, the first characteristic port impedance is equal to the second characteristic port impedance. Also, the characteristic impedance presented by the filter core structure to the first matching arrangement is advantageously identical to the characteristic impedance presented by the filter core structure to the second matching arrangement. In this case, the matching arrangements may be similar or even identical, which reduces design effort and design cost. Also, the filter characteristics are typically particularly good in such a design having symmetrical impedance levels.

In an advantageous embodiment, the filter core structure comprises a plurality of inductances which are implemented using transmission lines having transmission line impedances which are higher than the working impedance. It has been found that such an implementation of the inductances typically brings along lower losses and/or a better stop band rejection than many lumped element implementations. Also, fabrication is particularly simple.

In some embodiments, the filter structure also comprises a plurality of capacitances which are implemented using transmission lines having transmission line impedances which are smaller than the working impedance. This allows for a cost-efficient implementation of the filter structure with good quality.

In an advantageous embodiment, the first matching arrangement or the second matching arrangement is a L-network comprising a shunt impedance element and a series impedance element. It has been found that matching with sufficiently good broadband characteristics can be obtained using this matching concept. Also, implementation costs can be kept small. In addition, it has been found that this matching concept is typically well suited for matching between two different real impedances.

In an advantageous embodiment, the matching arrangement comprises a shunt capacitance and a series inductance, wherein the series inductance of the first matching arrangement is merged with a front inductance of the filter core structure. It has been found that in many cases, an efficient implementation of the matching arrangement and the filter core structure can be obtained by merging said two inductances. Accordingly, a size of the filter can be reduced and a discontinuity at the transition from the matching arrangement to the filter core structure can be avoided. Alternatively, or in addition, the second matching arrangement comprises a shunt capacitance and a series inductance, wherein the series inductance of the second matching arrangement is merged with a tail inductance of the filter core structure.

In an advantageous embodiment, the first matching arrangement or the second matching arrangement is a Π-network comprising at least two shunt impedance elements and a series impedance element circuited between the shunt impedance elements. Accordingly, particularly good matching can be obtained.

In another embodiment according to the invention, the first matching arrangement or the second matching arrangement is a T-network comprising at least two series impedance elements and a shunt impedance element circuited to a node which is electrically between the two series impedance elements. This arrangement also allows for particularly good matching.

In another embodiment according to the invention, the first matching arrangement comprises a plurality of cascaded L-networks. This allows to optimize the broadband characteristics of the matching network.

In an advantageous embodiment, the filter core structure is configured to form a low-pass filter, and the filter core structure comprises a plurality of series inductances circuited in series between a first end of the filter core structure, which is coupled to the first matching arrangement, and a second end of the filter core structure, which is coupled to the second matching arrangement. In this case, the series inductances of the filter core structure are implemented using transmission lines having a transmission line impedance which is higher than the working impedance (for example, by a factor of at least 1.5, or even by a factor of at least 2, or even by a factor of at least 3 or 4). Accordingly, a good stop band rejection can be obtained, because the working impedance can be adjusted such that the series inductances can be implemented with comparatively small parasitic capacitance.

Thus, a downscaling of the working impedance (which may be smaller, by a factor of at least 1.5, or at least 2, or at least 3, or at least 4, than the first characteristic port impedance or the second characteristic port impedance) ensures that the inductance of the transmission line portions used to implement the series inductances is not severely degraded by parasitic capacitances.

In an advantageous embodiment, the series inductances of the filter core structure are implemented using strip lines comprising a conductive strip arranged between two ground layers. Such an arrangement provides a good shielding for the filter structure. Also, the implementation of series inductances using the strip lines is facilitated by providing the possibility to appropriately select the working impedance of the filter core structure to be different from the first characteristic port impedance and the second characteristic port impedance.

An advantageous embodiment according to the invention also creates a double filter structure. This double filter structure comprises a first filter structure, as discussed before, and also a second filter structure, as discussed before. The first filter structure comprises a first filter core structure and the second filter structure comprises a second filter core structure. The first filter core structure comprises a first filter core structure port, a second filter core structure port, a plurality of series impedance elements circuited between the first filter core structure port and the second filter core structure port and a plurality of shunt impedance elements. The shunt impedance elements of the first filter core structure are implemented using transmission line structures coupled to nodes which are electrically between subsequent series impedance elements of the first filter core structure. The second filter core structure comprises a third filter core structure port, a fourth filter core structure port, a plurality of series impedance elements circuited between the third filter core structure port and the fourth filter core structure port, and a plurality of shunt impedance elements. The shunt impedance elements of the second filter core structure are implemented using transmission line structures coupled to nodes which are electrically between subsequent series impedance elements of the second filter core structure. The shunt impedance elements of the first filter core structure are arranged in different conducting layers of a multi-layer structure, and the shunt impedance elements of the second filter core structure are arranged in different conducting layers of the multi-layer structure. A transmission line structure used to implement a first shunt impedance element of the first filter core structure and a transmission line structure used to implement a second shunt impedance element of the second filter core structure are arranged in the same conducting layer of the multi-layer structure. Also, a transmission line structure used to implement a second shunt impedance element of the first filter core structure and a transmission line structure used to implement a first shunt impedance element of the second filter core structure are arranged in the same conducting layer of the multi-layer structure. The transmission line structure used to implement the first shunt impedance element of the first filter core structure and the transmission line structure used to implement the first shunt impedance element of the second filter core structure are at least partly overlapping in a projection perpendicular to a main surface (or a conducting layer) of the multi-layer structure, with a conductive shielding in between. The transmission line structure used to implement the second shunt impedance element of the second filter core structure and the transmission line structure used to implement the second shunt impedance element of the first filter core structure are at least partly overlapping in a projection perpendicular to the main surface of the multi-layer structure, with a conductive shielding in between. This arrangement allows for a space-saving implementation of the filter in a multi-layer structure or multi-layer substrate.

In an advantageous embodiment, the shunt impedance elements of the first filter core structure are arranged in different conducting layers of the multi-layer structure, such that a via inductance is arranged in series with at least one of the shunt impedance elements of the first filter core structure. Similarly, the shunt impedance elements of the second filter core structure are arranged in different conducting layers of the multi-layers structure, such that a via inductance is arranged in series with at least one of the shunt impedance elements of the second filter core structure. Accordingly, a size of the implementation can be further reduced by exploiting the possibility to have via inductances within the filter core structure. Also, the exploitation of such via impedances in combination with an interleaving of the transmission line structures of the two filter core structures allows for a particularly space-saving implementation with comparatively low parasitics.

BRIEF DESCRIPTION OF THE DRAWINGS

Embodiments of the present invention will be detailed subsequently referring to the appended drawings, in which:

FIG. 3c shows a schematic of another filter derived from the standard lump low-pass of FIG. 3a after scaling the internal impedance, with a L-network implementation of the ideal transformers, together with a source and a load; and FIG. 3d shows a schematic of a filter structure, which is obtained by rearrangement of the elements of the filter of FIG. 3c, together with a source and a load;

FIG. 5a shows a graphical representation of a first filter of an interleaved realization of two filters in a multi-layer printed circuit board;

FIG. 5b shows a graphical representation of a second filter of an interleaved realization of two filters in a multi-layer printed circuit board;

DETAILED DESCRIPTION OF THE INVENTION

Figure 1:
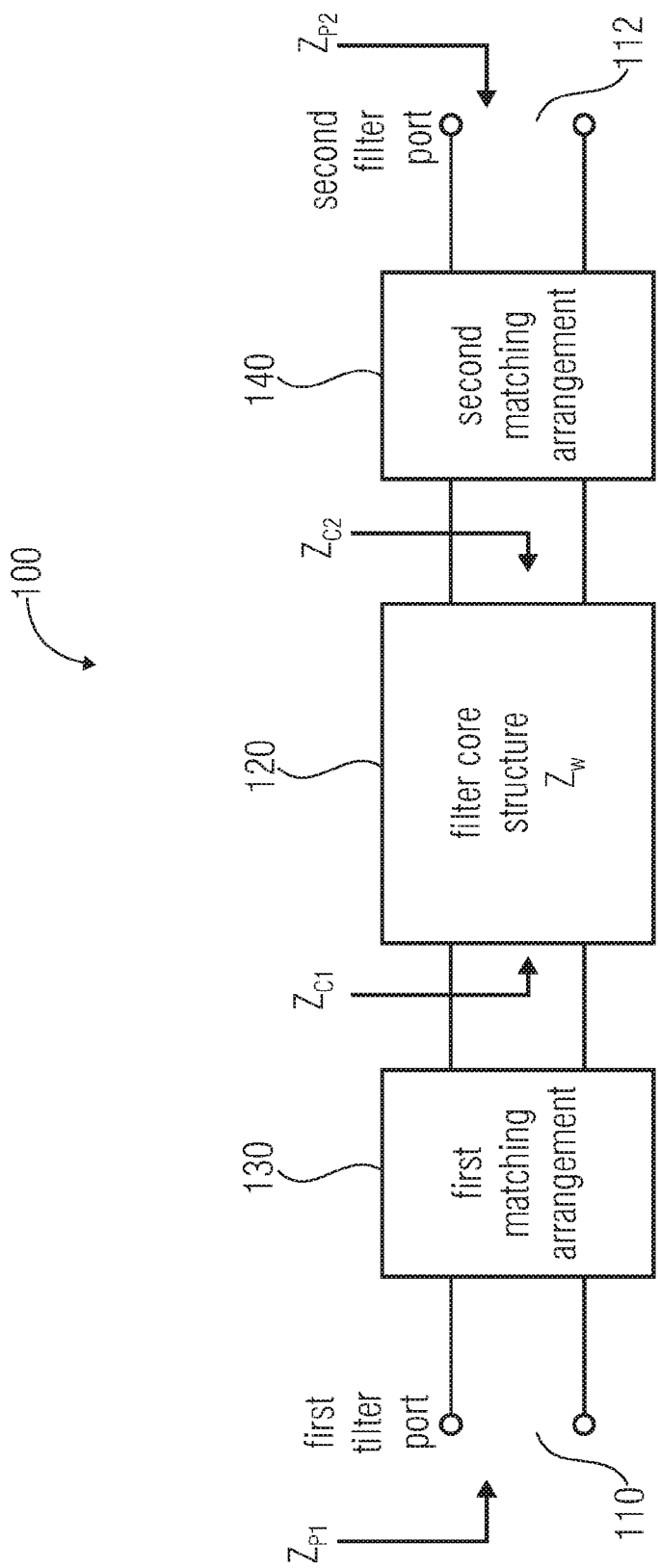
FIG. 1 shows a block schematic diagram of an exemplary electrical filter structure, according to a first embodiment of the invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "allocating," "associating," "moving," "copying," "setting," "accessing," "erasing," "freeing," "controlling," "adding," "recording," "determining," "identifying," "caching," "maintaining," "incrementing," "comparing," "removing," "reading," "writing," or the like, refer to actions and processes of a computer system or similar electronic computing device or processor. The computer system or similar electronic computing device manipulates and transforms data represented as physical (electronic) quantities within the computer system memories, registers or other such information storage, transmission or display devices.

1. Filter Structure According to FIG. 1

In the following, an exemplary filter structure 100 will be described. A block schematic diagram of the filter structure 100 is shown in FIG. 1.

The filter structure 100 is configured to forward an electrical signal from a first (external) filter port 110 to a second (external) filter port 112 in a frequency-selective manner, to implement, for example, a low-pass filter characteristic, a high-pass filter characteristic or a band-pass filter characteristic. The first filter port 110 comprises a first characteristic port impedance $Z_{P1}$, and the second filter port 112 comprises a second characteristic port impedance $Z_{P2}$.

The filter structure 100 also comprises a filter core structure 120 having a working impedance $Z_W$, wherein the working impedance is different from the first characteristic port impedance $Z_{P1}$ and from the second characteristic port impedance $Z_{P2}$. The working impedance of the filter core structure 120 describes an impedance level of the filter core structure. In many cases, the working impedance of the filter core structure is equal to a characteristic impedance presented by the filter core structure at the ports of the filter core structure in the pass band. In other words, the working impedance of the filter core structure is typically equal to an impedance level which should be present at the input and at the output of the filter core structure in order to obtain a minimum insertion loss in the passband. For semi-lumped implementations, the working impedance of the filter is typically between the transmission line impedance of a low-impedance transmission line and the transmission line impedance of a high-impedance transmission line. The working impedance (or inner impedance) of the filter may for example be equal to an arithmetic or geometric mean of the impedances of the high impedance transmission lines and the low impedance transmission lines.

The filter structure 100 also comprises a first matching arrangement 130, which is electrically coupled between the first filter port 110 and the filter core structure 120. The first matching arrangement 130 is configured to perform an impedance matching between the first characteristic port impedance $Z_{P1}$ and a characteristic impedance $Z_{C1}$ presented by the filter core structure 120 to the first matching arrangement 130. In addition, the filter structure 100 also comprises a second matching arrangement 140 electrically coupled between the second filter port 112 and the filter core structure 120. The second matching arrangement 140 is configured to perform an impedance matching between the second characteristic port impedance $Z_{p2}$ and the characteristic impedance $Z_{C2}$ presented by the filter core structure 120 to the second matching arrangement 140.

Herein, the term "characteristic impedance" designates an impedance for which a desired filter characteristic (for example a minimum insertion loss in a passband) occurs.

The filter structure 100 allows for the implementation of the filter core structure, such that parasitics of the lumped or semi-lumped impedance elements can be kept sufficiently small. Thus, the working impedance of the filter core structure, which is also sometimes designated as the "internal impedance of the filter," can be scaled to an appropriate level, $Z_w$, which is different from the characteristic port impedances $Z_{P1}$, $Z_{P2}$, and which is appropriate for a good implementation of the filter core structure 120. The input or the output of the filter core structure 120 are matched to the desired external impedances, e.g. to the first (characteristic) port impedance $Z_{P1}$ and the second (characteristic) port impedance $Z_{P2}$, using matching networks, e.g. the first matching arrangement 130 and the second matching arrangement 140. Accordingly, the sensitivity of a standard lumped filter or semi-lumped filter to parasitic shunt capacitances associated with each inductor may, for example, be reduced.

To summarize, the filter structure 100 according to FIG. 1 allows to obtain sufficiently good pass band characteristics and stop band characteristics, wherein it is typically possible to obtain, using a given technology, better characteristics than it would be possible using a filter core structure having a working impedance which is equal to the port impedances $Z_{P1}$, $Z_{P2}$.

Further Details regarding the design of the Filter Structure 100 will be discussed below.

2. Filter Structure According to FIG. 2

Figure 2:
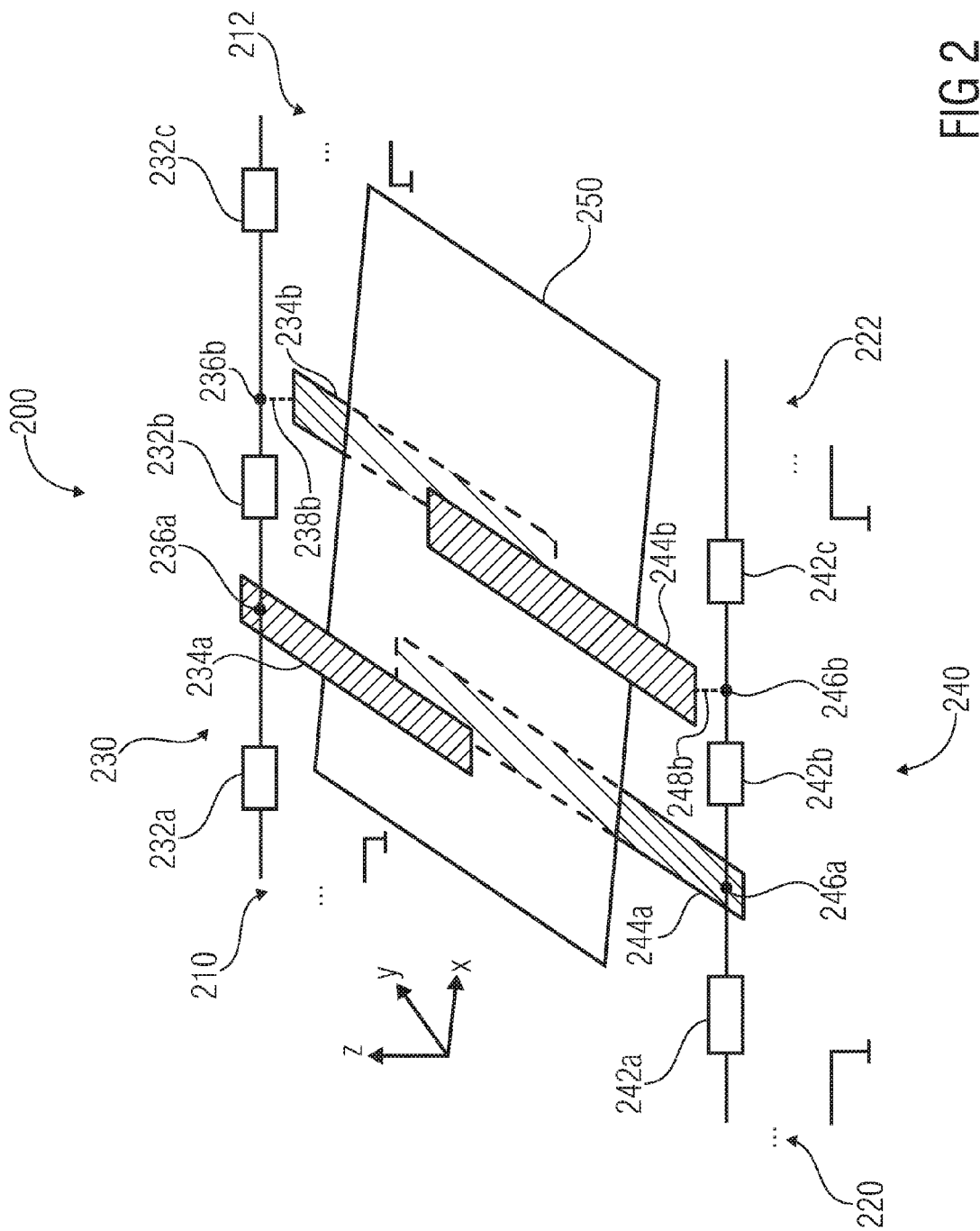
FIG. 2 shows a block schematic diagram of another exemplary filter structure, according to another embodiment of the invention.

FIG. 2 shows a schematic representation of an exemplary filter structure, according to another embodiment of the invention.

The filter structure 200 of FIG. 2 may be considered as a double filter structure and is configured for forwarding a first electrical signal from a first filter port 210 to a second filter port 212 in a frequency-selective manner, and for forwarding a second electrical signal from a third filter port 220 to a fourth filter port 222 in a frequency-selective manner.

The filter structure 200 comprises a first filter core structure 230 comprising a first filter port 210, a second filter port 212, a plurality of series impedance elements 232a, 232b, 232c electrically coupled between the first filter port 210 and the second filter port 212 and a plurality of shunt impedance elements 234a, 234b. The shunt impedance elements 234a, 234b of the first filter core structure 230 are implemented using transmission line structures coupled to nodes 236a, 236b, which are electrically between subsequent series impedance elements 232a, 232b; 232b, 232c of the first filter core structure 230.

The filter structure 200 also comprises a second filter core structure 240 comprising a third filter port 220, a fourth filter port 222, a plurality of series impedance elements 242a, 242b, 242c electrically coupled between the third filter port 220 and the fourth filter port 222 and a plurality of shunt impedance elements 244a, 244b. The shunt impedance elements 244a, 244b of the second filter core structure 240 are implemented using transmission line structures coupled to nodes 246a, 246b, which are electrically between subsequent series impedance elements 242a, 242b; 242b, 242c of the second filter core structure 240.

The shunt elements 234a, 234b (or more precisely, transmission line structures used to implement said shunt impedance elements) of the first filter core structure 230 are arranged in different conducting layers of a multi-layer structure, such that, advantageously but not necessarily, a via impedance (of a via 238b) is arranged in series with at least one of the shunt impedance elements 234b of the first filter core structure 230. The shunt impedance elements 244a, 244b (or more precisely, transmission line structures used to implement said shunt impedance elements) of the second filter core structure 240 are arranged in different conducting layers of the multi-layer structure, such that, advantageously but not necessarily, a via inductance (of a via 248b) is arranged in series with at least one of the shunt impedance elements 244b of the second filter core structure 240.

The transmission line structure used to implement the first shunt impedance element 234a of the first filter core structure 230 and the transmission line structure 244b used to implement a second shunt impedance element of the second filter core structure 240 are arranged in a same (e.g. a common) conducting layer of the multi-layer structure. Similarly, the transmission line structure 234b used to implement a second shunt impedance element of the first filter core structure 230 and the transmission line structure 244a used to implement a first shunt impedance element of the second filter core structure 240 are arranged in a same (e.g. in a common) conducting layer of the multi-layer structure.

The transmission line structure 234a used to implement the first shunt impedance element of the first filter core structure 230 and the transmission line structure 244a used to implement the first shunt impedance element of the second filter core structure 240 are at least partly overlapping in a projection perpendicular to a main surface (which main surface is typically parallel to the conducting layers, or may even be formed by a top conducting layer or a bottom conducting layer) of the multi-layer structure with a conductive shielding 250 in between. The transmission line structure 244b used to implement the second shunt impedance element of the second filter core structure 240 and the transmission line structure 234b used to implement the second shunt impedance element of the first filter core structure 230 are at least partly overlapping in a projection perpendicular to a main surface of the multi-layer structure with the conductive shielding 250 in between.

The filter structure (or double filter structure) 200 of FIG. 2 allows a very compact implementation of a filter structure, while it is still possible to exploit via impedances, which can be obtained by arranging the transmission line structures 234a, 234b, 244a, 244b used to implement the shunt impedance elements in different conducting layers of the multi-layer structure. It is appreciated, a spatial interleaving of the transmission line structures 234a, 234b, 244a, 244b can be obtained both in a direction z perpendicular to a main surface of the multi-layer structure and in a direction x which is parallel to the main surface of the multi-layer structure (and which direction x may be identical to a main propagation direction or average propagation direction from the input ports 210, 220 of the filter core structures 230, 240 to the output ports 212, 222 of the filter core structures 230, 240. Thus, the filter structure 200 performs better than a planar filter structure in which all the shunt impedance elements are implemented in the same conducting layer.

Also, the area and number of layers that may be used for the implementation of the filter structure 200 is typically significantly smaller than the area that may be used for the implementation of two separate filter structures.

Naturally, the filter structure 200 can be combined with a matching arrangement 130, 140 discussed above, wherein one or more of the matching arrangements may be connected between the ports 210, 212, 220, 222 and corresponding external filter ports. Thus, a working impedance of the filter structure 200 may be different from an impedance of transmission lines coupled to the filter structure 200. Also, the filter structure 200 may, for example, serve as the filter core structure 120.

Further details will be discussed in the following.

3. Filter Structures According to FIGS. 3A TO 3D

In the following, details regarding the design of an impedance-scaled low pass filter will be described taking reference to FIGS. 3a to 3d. Reference is also made to the general design rules for a filter, which have been discussed with reference to FIGS. 6a and 6b.

3.1. General Design Rules

Figure 6A:
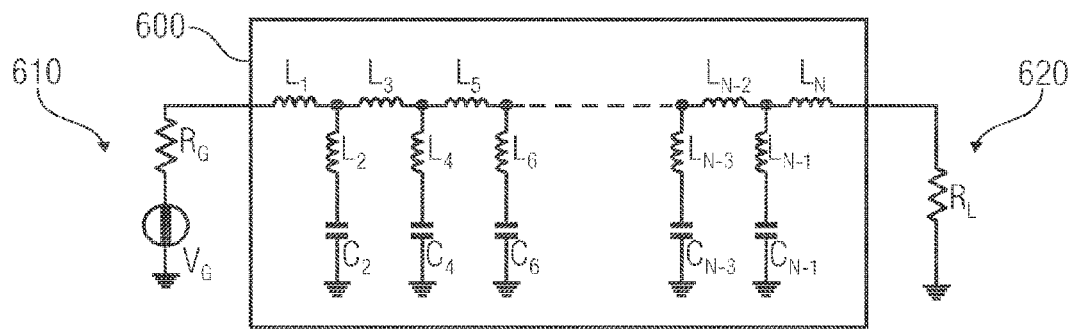
FIG. 6a shows a schematic of a lumped low-pass filter.
Figure 6B:
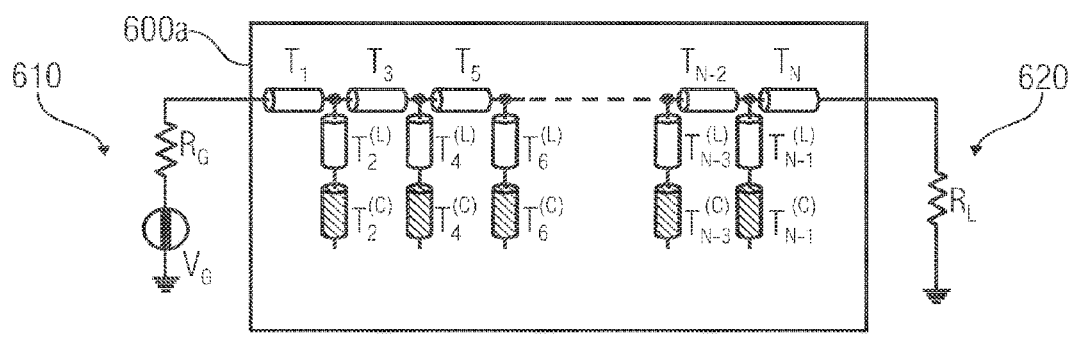
FIG. 6b shows a schematic of a semi-lumped low-pass filter.

As outlined above, FIG. 6a shows a schematic of a conventional lumped N-order low-pass filter (LPF). The filter is placed between a source ($V_G$, $R_G$) and a load ($R_L$). Usually, the internal impedance of the source ($R_G$) and the load impedance ($R_L$) are purely resistive: this justifies why the drawings of FIGS. 6a and 6b represent them as resistors. Moreover, load and source impedance are typically coincident and equal to 50Ω in most cases. The filter itself consists of floor(N/2) series inductors ($L_1, L_3, \ldots L_N$) and ceil(N/2) shunt series LC cells ($L_2$-$C_2$, $L_4$-$C_4$, $\ldots$, $L_{N-1}$-$C_{N-1}$). More precisely, the inductors of the above-mentioned shunt cells are short-circuited in all-poles types of filters, such as Butterworth, Chebyshev and Bessel.

FIG. 6b shows a so-called semi-lumped realization of the filter in FIG. 6a: all the inductors (capacitors) are realized with transmission line segments having high (low) characteristic impedance. Herein, the qualifications "high" and "low" denote values which are much greater and much smaller than the working impedance of the filter.

3.2. Technological Background Considerations

In the following, it will be discussed how an impedance-scaled filter can be derived from a conventional filter described in FIGS. 6a and 6b. It should be noted that obtaining impedance values which are much greater and much smaller than the working impedance of the filter is specifically the performance to obtain, in which the embodiments of the present invention help. In other words, the embodiments of the present invention allow the use of a working impedance of the filter core structure such that transmission line structures having an impedance which is significantly smaller than the working impedance and transmission line structures having an impedance which is significantly larger than the working impedance can both be implemented using a readily available technology and at moderate effort.

Some embodiments, according to the invention, are related to a multi-layer printed circuit—such as low-temperature co-fired ceramic (LTCC)—realization of the network shown in FIG. 6b. Both microstrip and strip line implementations are in principle possible, although the latter presents advantages from the utilization point of view in that it is inherently totally shielded.

In this regard, typical numbers for the strip line are: substrate thickness B=1 mm, dielectric relative permittivity $\in_r$=8, and minimum realizable width w=0.1 mm. With these values, the maximum achievable characteristic impedance is about 69Ω, which is not significantly higher than 50Ω (which is the typical standard transmission line impedance).

It has been found that this would lead to a poor stop-band response (low rejection) of the filter. It has also been found that in order to improve this performance, it would be useful to increase the substrate thickness B and/or to reduce the strip line with w. Unfortunately, it has been found that the characteristic impedance is approximately proportional to the logarithm of the ratio B/w. Therefore, a small increase of the characteristic impedance involves a large reduction of w, with the consequent criticality in the realization process and high associated series resistance, and/or an increase of B, thus increasing the number of stacked layers or the individual layer thickness. Shortly, both these solutions are impractical or at least costly. More in general, in the implementation of a series inductor (or series inductance) will exhibit high parasitic shunt capacitance.

3.3. Design of an Impedance-scaled Filter According to FIG. 3b

In the following, improvements, which can be obtained on the basis of the above-discussed will be explained in detail.

It should be noted here that FIGS. 3a to 3d show schematics of standard and impedance-scaled low pass filters.

Figure 3A:
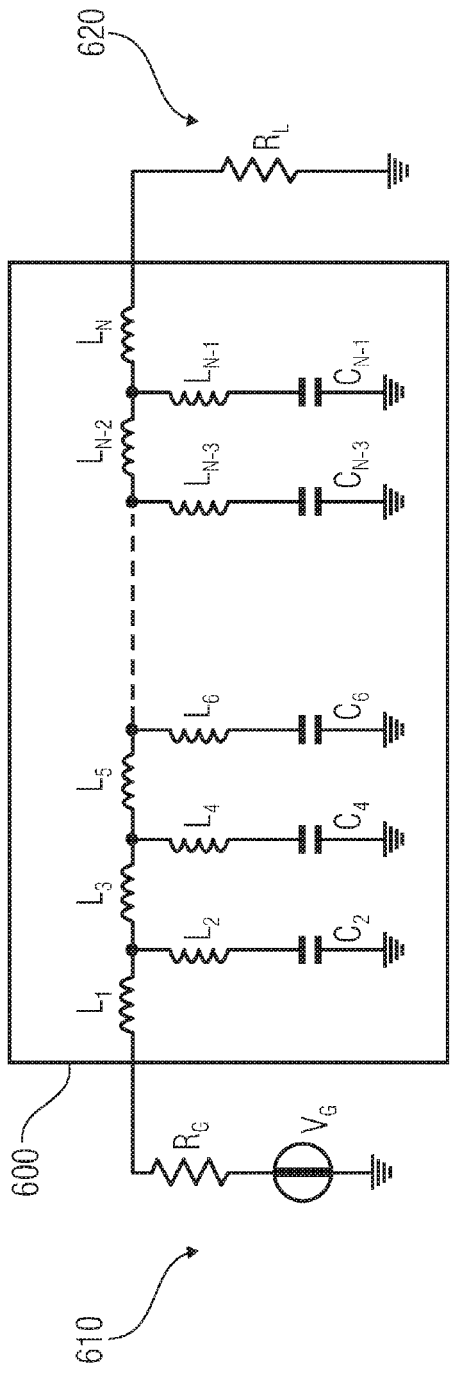
FIG. 3a shows a schematic of a standard lumped low-pass filter, together with a source and a load.

FIG. 3a shows a standard lumped low pass. FIG. 3a is identical to FIG. 6a and is replicated here for clarity.

Figure 3B:
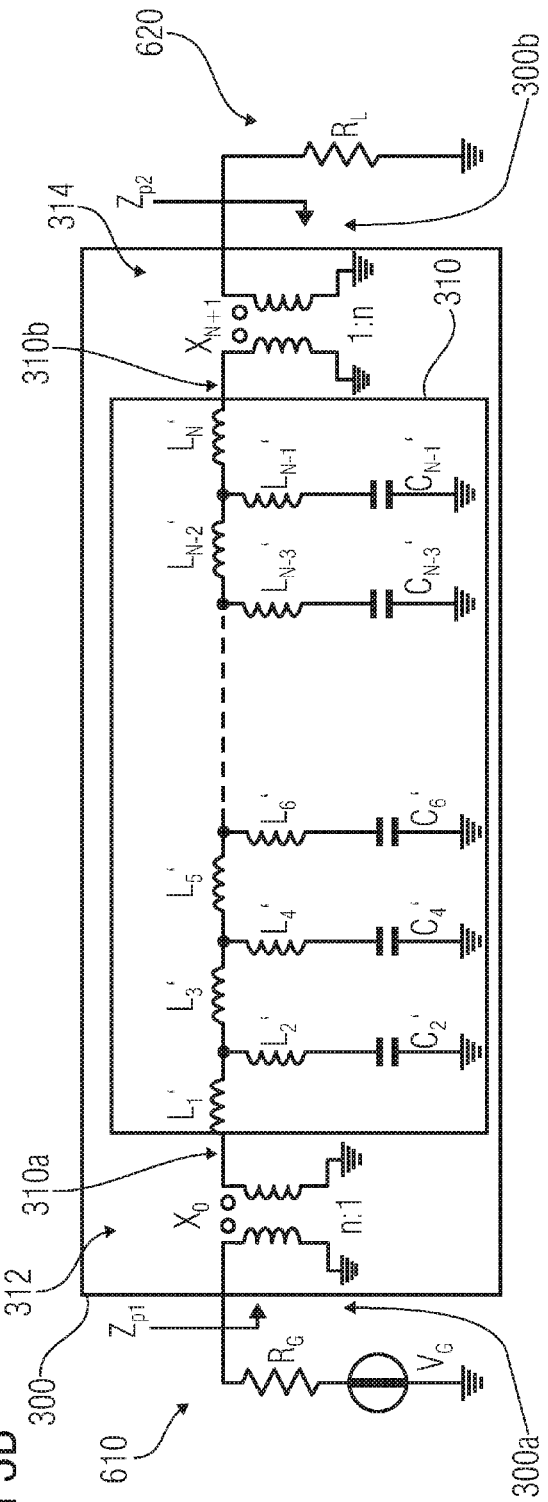
FIG. 3b shows a schematic of a filter derived from the standard lumped low-pass of FIG. 3a after scaling the internal impedance, together with a source and a load.

FIG. 3b shows a schematic of a filter derived from the filter of FIG. 3a after scaling the internal impedance. In other words, the schematic of FIG. 3b depicts a principle diagram of an embodiment of the present invention to circumvent the problem, which is a scaled-impedance low-pass filter (SILPF). The internal impedance of the filter (or filter core structure) is smaller than the one of the source 610 (for example, a voltage source having a no-load voltage $V_G$ and the inner resistance $R_G$) and of the load 620 (for example, a resistor having a resistance $R_L$), while two ideal transformers 312, 314 (also designated with $X_0$, $X_{N+A}$) match the filter on source and load again.

Given the internal impedance of the filter $R_{FILT}$ that may be used for optimum inductor performance, the transforming ratio of the transformers 312, 314 ($X_0$, $X_{N+A}$) is $$n = \sqrt{\frac{R_G}{R_{FILT}}} = \sqrt{\frac{R_L}{R_{FILT}}} \tag{1}$$

Consequently, the elements values of the scaled impedance filter are $$L'_k = \frac{L_k}{n^2} = \frac{R_{FILT}}{R_G} L_k = \frac{R_{FILT}}{R_L} L_k \quad (k = 1, 2, \ldots N) \tag{2}$$

and $$C'_k = n^2 \cdot C_k = \frac{R_G}{R_{FILT}} C_k = \frac{R_L}{R_{FILT}} C_k \quad [k = 2, 4, 6, \ldots \text{floor}(N/2)]. \tag{3}$$

Thus, the filter core structure 310 is coupled to a first port (input port), at which the port impedance $Z_{P1}$ is presented, via the transformer 312, which can be considered as a first matching arrangement. Similarly, the filter core structure 310 is coupled to a second port, at which a second port impedance $Z_{P2}$ is presented, via the second transformer 314, which can be considered as a second matching arrangement.

The matching arrangements can be implemented in many different ways. By principle, the transformers 312, 314 could be realized by two coupled inductors, but this structure has a limited working bandwidth (in particular, it presents zero DC transmission) and is difficult to realize at high frequencies (in the order of 10 GHz and more). An alternative implementation could be the multi-section λ/4 transmission line transformer, which can potentially operate at higher frequencies and presents lower attenuation, but typically presents large size.

3.4. Design of an Impedance-scaled Filter According to FIG. 3c

Considering this, an embodiment according to the invention exploits the impedance transforming properties of a L network consisting of series inductor with a shunt capacitor.

FIG. 3c shows an exemplary realization of a filter 340 with two of such impedance transforming networks ($L_0$, $C_0$). In other words, FIG. 3c shows a schematic of a filter derived from the filter of FIG. 3a after scaling the internal impedance, with a L-network implementation of the ideal transformers.

After the application of this network transformation, there are two couples of series inductors $L_0+L_1'$ at the input and there are two couples of series inductors $L_N'+L_{N+1}$ at the output.

3.5. Design of an Impedance-scaled Filter According to FIG. 3d

It is appreciated, each series couple $L_0 L_1'$, $L_N' L_0$ simplifies to one single inductor $L_1'+L_0$, $L_N' L_0$, as shown in FIG. 3d. In other words, FIG. 3d shows a schematic of a filter structure which is obtained from the filter structure of FIG. 3c by a rearrangement.

Thus, the inventive filter structure according to FIG. 3d increases the network complexity with two additional shunt capacitors only (when compared to the filter structure of FIG. 3a).

3.6. Filter Structure Details

In the following, the filter structure 300 of FIG. 3 will be explained in additional detail. The filter structure 300 comprises the filter core structure 310. The filter core structure 310 comprises a first port (input port) 310a and a second port (output port) 310b. Similarly, the filter structure 300 comprises a first port 300a (input port) and a second port 300b (output port). The input port 300a of the filter structure 300 is coupled to the source 610 and the output port 300b of the filter structure 300 is coupled to the load 620.

Furthermore, the transformer 612 is electrically coupled between the first port 300a of the filter structure 300 and the first port 310a of the filter core structure 310. For example, a first winding of the transformer 312 is coupled to the first port 300a of the filter structure 300, and a second winding of the transformer 312 is coupled to the first port 310a of the filter core structure 310. A transformation ratio between the first winding and the second winding of the transformer 312 may be n:1. Similarly, the second port 312b of the filter core structure 310 is coupled to a first winding of the transformer 314, and the second port of the filter structure 300 is coupled to a second winding of the transformer 314. A transformation ratio between the first winding and the second winding of the transformer 314 may be 1:n.

The filter core structure 310 comprises a plurality of series inductors electrically coupled between the first port 310a and the second port 310b, wherein the series inductances are designated with $L_1'$ $L_3'$ ... $L_{N-2}'$ $L_N'$. Shunt impedance elements $L_2'-C_2'$, $L_4'-C_4'$, ..., $L_{N-3}'-C_{N-3}'$, $L_{N-1}'-C_{N-1}'$ are electrically coupled to nodes, which are arranged electrically between two subsequent of the series inductances $L_1'$ to $L_N'$. Some or all of the shunt impedance elements comprise, for example, a series resonance circuit comprising a pair of inductance (for example, $L_2'$) and a corresponding capacitance (for example, $C_2'$).

In the following, additional details regarding the filter structure 340 shown in FIG. 3c will be described. It should be noted that here the filter structure 340 differs from the filter structure 300 only in that the transformers 312, 314 are replaced by L networks 342, 344. A series inductance $L_0$ is electrically coupled between a first port 300a of the filter structure 340 and the first port 310a of the filter core structure 310. In addition, a shunt capacitance $C_0$ is electrically coupled in parallel with the first port 300a of the filter structure 340. Similarly, a series inductance $L_0$ is electrically coupled in series between the second port 310b of the filter core structure 310 and the second port 300b of the filter structure 340. In addition, a shunt capacitance $C_0$ is electrically coupled in parallel with the second port 300b.

It should be noted that the inductance $L_0$ of the first (input-sided) L matching arrangement 342 is in series with the inductance $L_1'$ of the filter core structure 310, and that the inductance $L_0$ of the second (output-sided) L matching arrangement 344 is in series with the inductance $L_N'$ of the filter core structure 310.

In the following, additional details regarding the filter structure 380 shown in FIG. 3d will be described. It should be noted that the filter structure 380 differs from the filter structure 340 in that the inductance $L_0$ of the matching arrangement 342 is merged with the first input-sided series inductance $L_1'$ of the filter core structure, to obtain a common matching-filter inductance $L_1+L_0$. Similarly, the inductance $L_0$ of the second L matching arrangement 344 is merged with the last output-sided series inductance of the filter core structure 310, to obtain a common filter-matching inductance $L_N'+L_0$. Apart from these modifications, the explanations regarding the filter structure 340 also apply.

4. Performance Evaluation

In the following, the performance of the filter structures 600 and 380, according to FIGS. 3a and 3d will be compared.

The filter structure 380 comprises an internal impedance (impedance of the filter core structure, which is also designated as "working impedance") of 25 Ohm. The external impedance (impedance presented at the external ports of the filter structure) is 50 Ohm.

Figure 4:
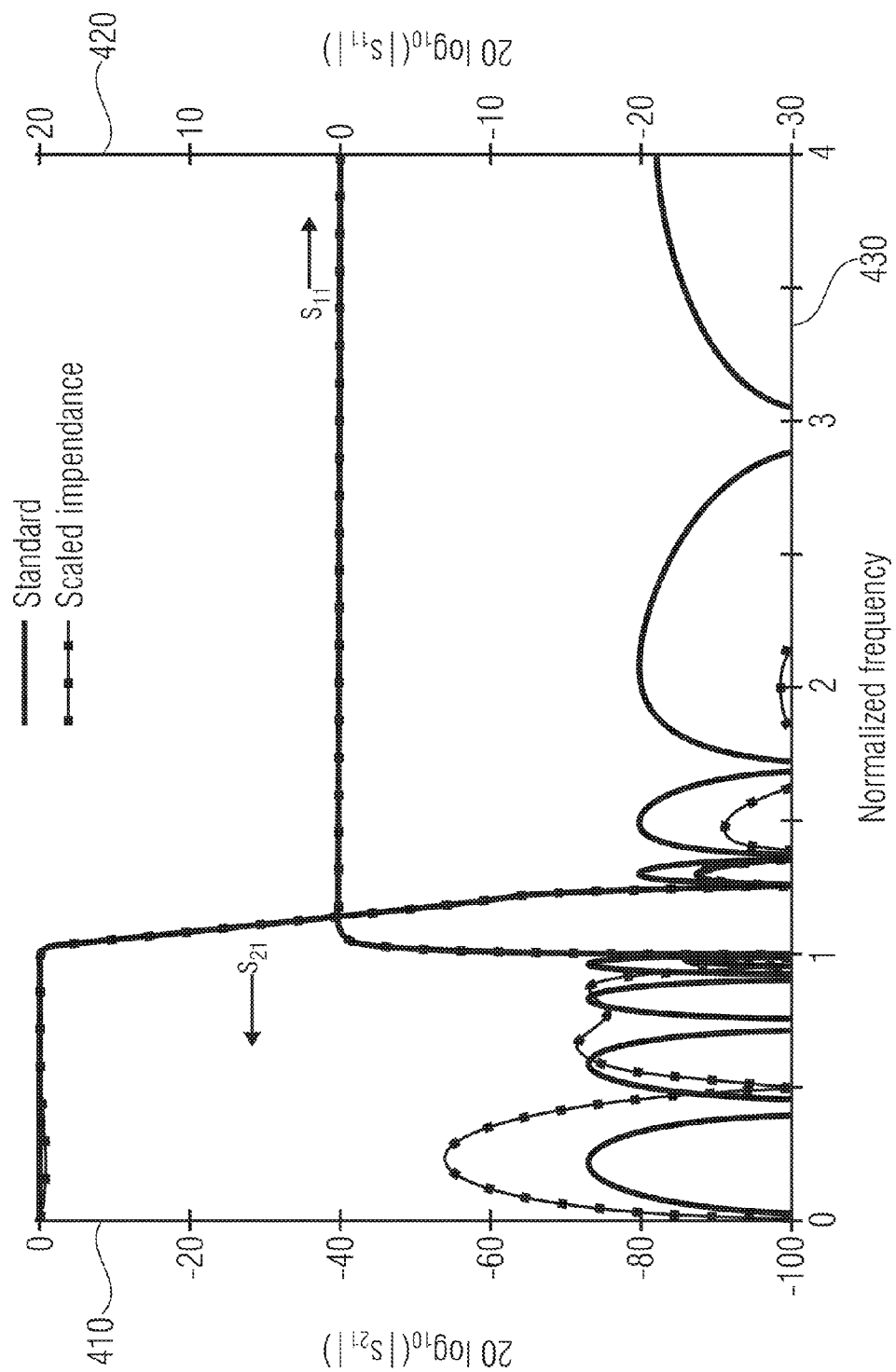
FIG. 4 shows a graphical representation of responses of a standard filter and of a scaled impedance filter.

FIG. 4 shows a plot of the responses of two ninth order low pass filter having a structure of FIG. 3a (gray lines) and FIG. 3d (black lines). In other words, FIG. 4 shows a graphical representation of responses of a standard filter (black lines) and of a scaled impedance filter (gray lines or dashed lines). The transmission coefficient ($c_{21}$) and the reflection coefficient $c_{11}$ of the two filters are plotted on the left and right y-axis (ordinate) 410, 420, respectively. Further, the frequency axis (abscissa) 430 is normalized to the cut off frequency $f_t$.

It can be noted that the scaled-impedance low pass filter (SILPF) presents almost the same impedance matching performances as the standard low pass filter LPF in a frequency range from $0.44 \times f_t$ to $f_t$. Below that lower limit, the scaled impedance filter performs worse than the standard one, although still transmitting the signal.

Moreover, in the important application of low pass filters as harmonic signal cleaner, the input frequency range is narrower than 1 octave. Therefore, the above-described limited working bandwidth is a non issue.

In the following, some advantages will be discussed, which can be obtained if the filter structure 380 according to FIG. 3d is implemented using a semi-lumped implementation. In such a semi-lumped implementation (or realization), inductances are placed by transmission line portions having an impedance which is higher than a working impedance of the filter core structure (e.g., higher than a characteristic impedance presented at a port of the filter core structure). Similarly, capacitances are implemented using transmission line portions having an impedance which is lower than a working impedance of the filter core structure (e.g., a characteristic impedance presented at a port of the filter core structure).

Passing from the ideal to a practical semi-land realization, the filter structure 380 of FIG. 3d offers, among others, the following three advantages:

1. Lower degradation of the inductor performances associated with their parasitic shunt capacitances because of the reduced internal impedance (also designated as working impedance) of the filter (or filter core structure) that causes lower voltages across the parasitic capacitances themselves.
2. Reduced inductance values, as a straightforward consequence of the equation (2) when assuming $R_{FILT} < R_G$, $R_{FILT} < R_L$, as per our hypothesis. As a trend, this also reduces the inductor size and associated parasitic capacitance to ground, reinforcing 1.
3. The stop-band attenuation of the scaled impedance filter is higher than the one of the corresponding standard solution as a consequence of the low-pass behavior of the L-network transformer ($L_0$, $C_0$).

From equation (3) and with the same assumptions as in 2, it also follows that the scaled impedance low-pass filter has higher capacitance values than its standard counterpart. However, this does not give bigger capacitor size, because the higher capacitance is achievable by means of closer ground planes in the transmission lines realizing the capacitors themselves.

5. Filter Implementation According to FIGS. 5A, 5B and 5C

In the following, an exemplary implementation of the filter structure 380 of FIG. 3d will be discussed.

Figure 5C:
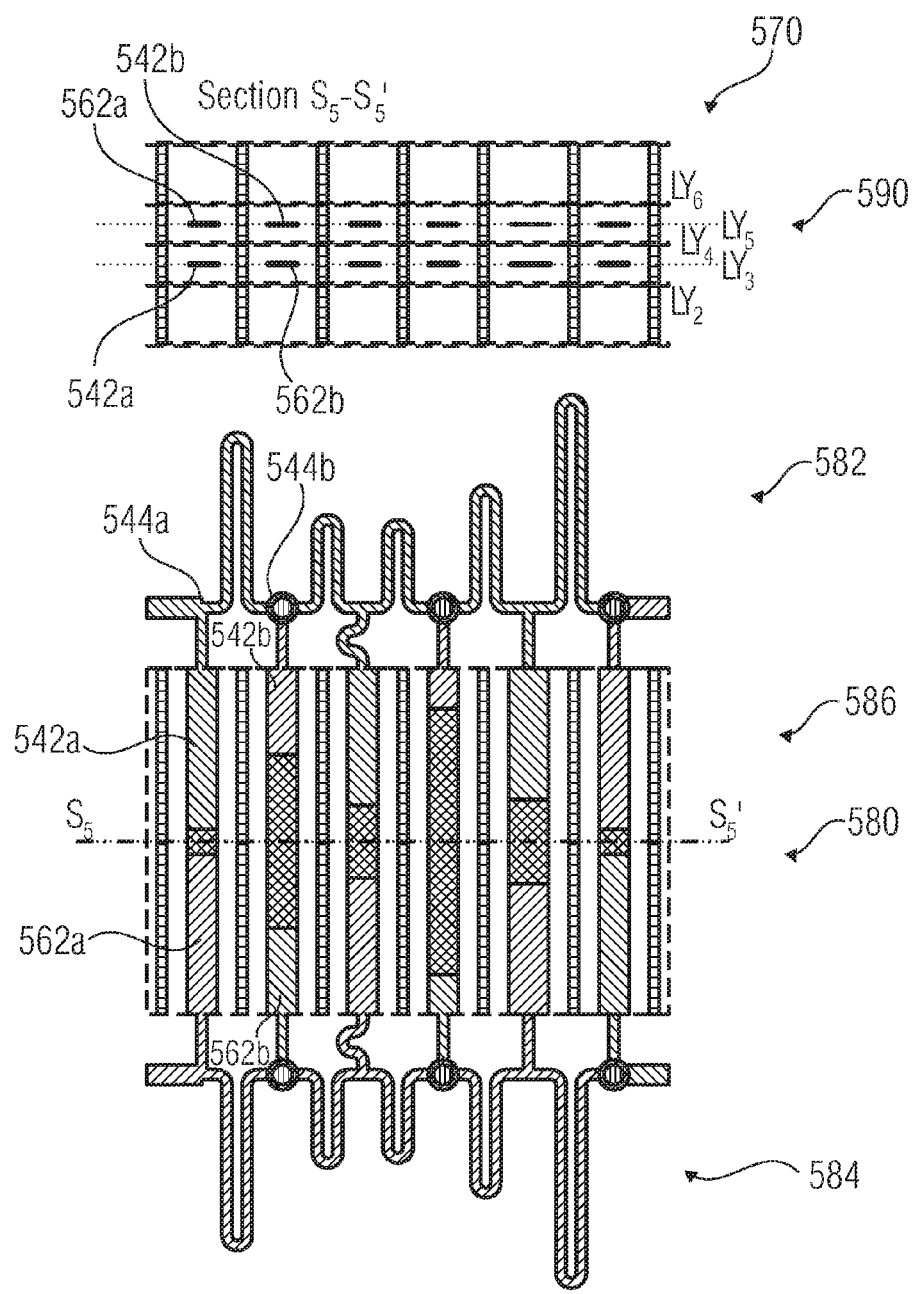
FIG. 5c shows a graphical representation of the result of an interleaving of the first filter according to FIG. 5a and the second filter according to FIG. 5b within the same substrate.

However, it should be noted that the implementation embodiments of the present invention described with reference to FIGS. 5a, 5b and 5c is also applicable in the absence of the matching arrangement, e.g. if the capacitors $C_0$ are omitted and the inductance $L_1'+L_0$ is replaced by the inductance $L_1'$ and the inductance $L_N'+L_0$ is replaced by the inductance $L_N'$. Also, it should be noted that the implantation embodiments of the present invention shown in FIGS. 5a, 5b and 5c can be applied independent on the actual impedance level of the filter structure or filter core structure. Moreover, it should be noted that the implementation embodiments of the present invention shown in FIGS. 5a, 5b and 5c can be used for both implementation of a single filter (as shown in FIGS. 5a and 5b) and for the implementation of double filter (as shown in FIG. 5c).

It should be noted that the implementation embodiments of the present invention, which is shown in FIGS. 5a, 5b and 5c, is particularly suited for the implementation of a SILPF filter structure using a multi-layer structure, like a multi-layer printed circuit board. For example, a printed circuit board using a FR4 material may be used in some embodiments. However, other materials are also well suited, like, for example, low-temperature co-fired ceramic multi-layer structures.

It should be noted that in an advantageous embodiment, the filter structure is implemented using a multi-layer structure comprising seven conducting layers $LY_1$ to $LY_7$, which are arranged in the order $LY_1$, $LY_2$, $LY_3$, $LY_4$, $LY_5$, $LY_6$, $LY_7$, with a dielectric layer in between any two adjacent conducting layers.

FIG. 5a shows, at reference numeral 510, a top view of a first single filter structure. A first cross sectional view, taken at a line $S_2S_2'$, is shown at reference numeral 520, and a second cross sectional view, taken at a line $S_1S_1'$, is shown at reference numeral 530. It is appreciated, an input feed line 512a is arranged in a third conducting layer $LY_3$, and an output feed line 512b is arranged in a fifth conducting layer $LY_5$.

A plurality of, for example, five (high-impedance) transmission lines (or transmission line portions) implementing inductances $L''_1$, $L'_3$, $L'_5$, $L'_7$, $L''_9$ are electrically coupled between the input feed line 512a and the output feed line 512b. Each of the transmission line portions implementing the inductances $L''_1$, $L'_3$, $L'_5$, $L'_7$, $L''_9$ comprises a U-shaped extension. It should also be noted that all of the transmission lines implementing the inductances $L''_1$, $L'_3$, $L'_5$, $L'_7$, $L''_9$ are arranged in the third conducting layer $LY_3$. Also, it should be noted that said transmission line portions are arranged in a portion 582 (also designated as "outer portion" or "outer region" sometimes) of the filter structure in which the second conducting layer LY2, the fourth conducting layer LY4 and the sixth conducting layer LY6 are left blank, such that said transmission line portions form strip line structures with the conducting layers $LY_1$, $LY_7$ acting as the ground layers of the strip line structure. Accordingly, there is a comparatively large distance between said transmission line portions (in layer LY3) implementing the inductances $L''_1$, $L'_5$, $L''_9$ and the corresponding ground layers LY1, LY7, such that a sufficiently high impedance of said transmission lines can be obtained with reasonable (yet comparatively small) width of the transmission lines.

In the following, details regarding the shunt impedance elements will be discussed, which are coupled to nodes which are electrically between the individual transmission line portions implementing the series inductances $L''_1$, $L'_3$, $L'_7$, $L''_9$.

Regarding the shunt impedance elements, it should be noted that the shunt impedance elements typically comprise a series connection of an inductive portion and of a capacitive portion. The inductive portion is typically represented by a comparatively narrow (higher impedance) transmission line portion, sometimes in combination with a via inductance. The capacitive portion is implemented by a comparatively wide (lower impedance) transmission line portion having a smaller transmission line impedance than the comparatively narrow transmission line portion. In the implementation of the capacitive portions, a special region 540 (also sometimes designated as "central region" 586) is used, in which the conducting layers $LY_2$, $LY_4$ and $LY_6$ are provided with ground planes.

In the central region 540, two rows of substantially brick-shaped subregions 532a to 532f and 532g to 532l are formed. Electrically shielded subregions 532a to 532f of the first row of electrically shielded subregions are arranged between ground layers formed in the conducting layers $LY_4$ and $LY_6$. Adjacent electrically shielded regions 532a to 532f are separated from each other by vertical ground structures 534a to 534e, which may be formed using trenches or rows of vias extending in a direction from one main surface of the multi-layer structure to another main surface of the multi-layer structure. Nevertheless, the electrically shielded regions may be open at two sides in some embodiments. Nevertheless, it is sufficient if the electrically shielded subregions are open at one side.

In the following, details regarding the implementation of the shunt impedance elements will be described. For example, a first shunt impedance element comprises a low impedance transmission line portion 542a, which is formed in the conducting layer $LY_3$ and which is further arranged within an electrically shielded subregion 532g bounded by ground layers in the electrically conducting layers $LY_2$ and $LY_4$ and vertical ground structures 533, 534a. The low impedance transmission line portion 542a is coupled with a node 544a via a high impedance transmission line portion 543a, wherein the node 544a is at a transition from the input feed line 512a to a transmission line structure implementing the inductance $L''_1$. Further, a low impedance transmission line portion 542b is arranged in the conducting layer $LY_5$ and within an electrically shielded subregion 532b, which is bounded by ground layers in the conducting layers $LY_4$ and $LY_6$ and the vertical ground structures 534a, 534b. The low impedance transmission line portion 542b is coupled to a node 544b using a high impedance transmission line 543b and a via 545b (extending between the layer LY3 and the layer LY5). Accordingly, the inductance of the via 545b and the inductance of the high impedance transmission line portion 543b are effective in series with the low impedance transmission line portion 542b. Accordingly, the via 545b and the high impedance transmission line portion 543b implement the inductance $L'_2$, and the capacitance $C'_2$ is implemented by the low impedance transmission line 542b. Similarly, the impedance $C'_4$ is implemented by a low impedance transmission line portion 542c, the inductance $L'_4$ is implemented by a high impedance transmission line portion 543c, and so on.

In FIG. 5a, schematic symbols of the capacitances and inductances implemented by the transmission line portions and vias are noted next to the respective elements. Also, the layers in which said transmission line portions and vias are arranged can be seen from the cross sectional views at reference numerals 520 and 530 and also from the hatching of said transmission line portions.

It should be noted that nodes, at which the high impedance transmission line structures implementing the series inductances $L''_1, L'_3, L'_5, L'_7, L''_9$ are linked with each other and with the structures implementing the shunt impedance elements are advantageously arranged along a line between a filter input and a filter output. Also, the center region 540 (also designated with 586) is advantageously rectangular in a top view onto the multi-layer structure, such that the low impedance transmission line structures 542a, 542b, 542c implementing the capacitances of the shunt impedance elements advantageously all start along a boundary line 550 between the outer region 582 and the central region 586. Thus, the low impedance transmission line portions 542a, 542b, 542c implementing the capacitances of the shunt impedance elements are entirely arranged within the central region 586, e.g. within the electrically shielded subregions formed within the central region.

In the following, the particular arrangement of a second filter structure will be discussed taking reference to FIG. 5b, which shows a top view at reference numeral 560a, a first cross-sectional view (taken at a line S4S4') at reference numeral 560b, and a second cross-sectional view (taken at line S3S3') at reference numeral 560c.

It should be noted that the same element symbols (for example $L''_1, L'_3, L'_5, L'_7, L''_9, C_0, C'_2, C'_4, C'_6, C'_8, C_0$) are used for the discussion of the second filter structure when compared to the first filter structure. Nevertheless, it should be noted that the second filter structure is electrically independent from the first filter structure, such that the first filter structure and the second filter structure may forward a signals which are electrically independent from each other.

It is appreciated from a comparison of FIGS. 5a and 5b, the second filter structure is approximately axial symmetrical to the first filter structure. However, the low-impedance transmission line structures used to implement the shunt impedance elements of the second filter structure are arranged in different electrically shielded subregions than the low-impedance transmission line structures used to implement the shunt impedance elements of the first filter structure.

For example, while the low impedance transmission line portion 542a is arranged within the electrically shielded subregion 532g, the low impedance transmission line portion 562a is arranged within the electrically shielded subregion 532a. Thus, corresponding low-impedance transmission line portions 542a, 562a of the first filter structure and of the second filter structure are arranged in different conducting layers (for example, conducting layer $LY_3$ versus conducting layer LY5), and are enclosed (for example at four sides) in vertically adjacent electrically shielded subregions 532g, 532a.

Also, it should be noted that the low impedance transmission line structures used to implement the shunt impedance elements of one of the filter structures are not all arranged in the same electrically conducting layer, but in different electrically conducting layers. For example, some of the low impedance transmission line structures used to implement shunt impedance elements of the first filter structure are arranged in a conducting layer $LY_3$, and some other of the low impedance transmission line structures used to implement shunt impedance elements of the first filter structure are arranged in the conducting layer $LY_5$. This allows to make use of via inductances for the implementation of the shunt impedance elements.

Also, the first filter structure (shown in FIG. 5a) and the second filter structure (shown in FIG. 5b) use "complementary" conducting layers for corresponding shunt impedance elements, such that a shunt impedance element of the second filter structure is implemented in the layer LY5 and the corresponding shunt impedance element of the first filter structure is implemented in the layer $LY_3$, and vice versa.

Taking reference now to FIG. 5c, which shows a top view 580 and a cross sectional view 590 (taken at a line $S_5S_5'$) of a double filter structure comprising both the first filter structure of FIG. 5a and the second filter structure of FIG. 5b, it can be seen that the inductances of the first filter structure are implemented using high impedance transmission line portions and vias, which are arranged in a first outer portion 582. Inductances of the second filter structure are implemented using high impedance transmission lines and vias which are arranged in a second outer portion 584. Capacitances of both the first and the second filter structures are implemented in a central region 586 of the double filter structure. It is appreciated, the low impedance transmission line portions used to implement the shunt impedance elements of the first and second filter structure overlap in a projection (top view 580) perpendicular to a main surface (or a conducting layer) of the multi-layer structure. However, the ground layer LY4 is naturally between low impedance transmission line portions of the first and second filter structure. It should also be noted that the overlap regions are shown by a cross-hatching in FIG. 5c.

In the following, the double filter structure, which is explained with reference to FIGS. 5a, 5b and 5c, will be briefly summarized. FIG. 5a shows one possible realization of the scaled-impedance low-pass filter with a multi-layer printed circuit. More precisely, FIG. 5a shows a 9-th order elliptic filter (also known as a "Cauer" filter). FIG. 5 shows an interleaved realization of two filters in multi-layer PCB, wherein FIG. 5a shows a first filter, FIG. 5b shows a second filter and FIG. 5c shows an interleaving of the filters of FIGS. 5a and 5b within the same substrate.

That structure consists of six stacked dielectric layers with seven metal layers $LY_1$ to $LY_7$ in between. The high impedance lines realizing the series inductors have the two extreme metal layers $LY_7$ and $LY_1$ as ground planes, as shown in the cross section $S_2$-$S_2'$ at reference numeral 520. It should be noted that the more external inductors $L_1''$ and $L_9''$ also embed $L_0$. Therefore, it is $L_1''=L_0'+L_1'$ and $L_9''=L_0'+L_9'$.

As anticipated, the ground planes for the capacitor transmission lines ($C_0, C_2', C_4', C_6', C_8', C_0$) are closer to the relative strip line (or strip line signal line), for example layers $LY_2, LY_4$ for $C_0, C_4', C_8'$ and layers $LY_4, LY_6$ for $C_2', C_6', C_0$.

This can be seen in the section $S_1$-$S_1'$, which is shown at reference numeral 530. Furthermore, the strip line metallization (e.g., of the strip line signal line) of inductors and capacitors are alternatively realized on the metal layers $LY_3$ and $LY_S$.

All the different ground planes (for example, layers $LY_1$, $LY_2$, $LY_4$, $LY_6$ and $LY_5$) are connected together by means of via structures (for example, vertical ground structures 533, 534a, 534b, 534c, 534d, 534e, 535).

From an inspection of the section $S_1$-$S_1'$, which is shown at reference numeral 530, it is possible to see that above (below) the capacitors $C_0$, $C_4'$, $C_8'$ ($C_2'$, $C_6'$, $C_0$), which are implemented using low impedance transmission line portions, there is an empty place between the layers $LY_4$, $LY_6$ ($LY_2$, $LY_4$). That empty space is completely shielded from the adjacent capacitors from the ground planes and the via structures (or by means of the ground planes LY2, LY4, LY6 and the via structures 533, 534a to 534e, 535).

It has been found that it (the empty space, which is also designated as an electrically shielded region or subregion) can therefore be used to insert capacitors belonging to another filter (also designated as filter structure), if this has the alternative structure with respect of the one in FIG. 5a, e.g. the one in FIG. 5b.

This second filter (or filter structure), which is shown in FIG. 5b, realizes the capacitors $C_0$, $C_4'$, $C_8'$ where the one in FIG. 5a (e.g. the first filter structure) realizes the capacitors $C_2'$, $C_6'$, $C_0$, and vice versa.

FIG. 5c depicts the resulting structure coming from the interleaved combinations of the ones in FIGS. 5a and 5b. It can be seen that all the capacitors of any filter are mutually isolated, and that the area for two filters is approximately 1.5 times the area for one single filter.

Accordingly, two electrically well-isolated filters or filter structures can be implemented using the common central portion 586. Accordingly, the implementation is space-efficient.

6. Exemplary Dimensions

Figure 7:
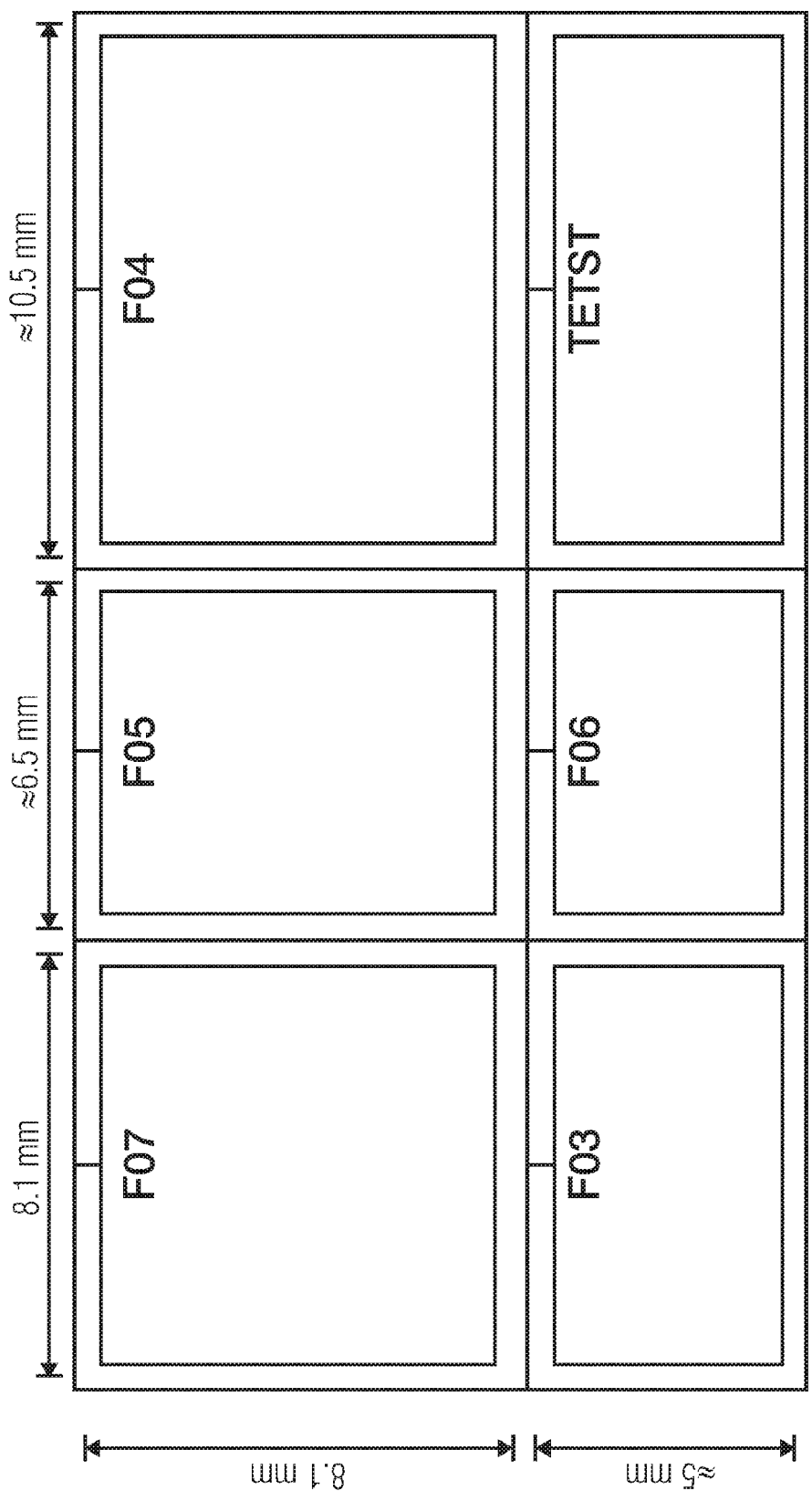
FIG. 7 shows a graphical representation of a mask set for fabrication of five filters and a test structure.

In the following, dimensions of some embodiments according to the invention will be briefly discussed taking reference to FIG. 7, which shows a mask set of a LTCC filter. The masked set represented in FIG. 5 comprises five filters F03, F04, F05, F06 and F07. Also, the masked set comprises a test structure TETST.

It is appreciated, the dimension of the smallest filter F06 may be approximately 5 mm×6.5 mm. A dimension of the largest filter may be approximately 8.1 mm×8.1 mm. It can be seen here that filters can be implemented using a space which may be smaller than 100 mm². The thickness of the multi-layer structure may be typically in the range of 1 mm for instance, and a relative permittivity of the dielectric layers of the multi-layer structure may be typically of the order of $\in_r$=8 for instance.

However, different dimensions are naturally possible, depending on the requirements of the filter.

7. Conclusion

In the following, some aspects of embodiments of the present invention will be briefly summarized.

An embodiment according to the invention creates a method to reduce a sensitivity of a standard lumped filter, which is shown in FIG. 3a, to parasitic shunt capacitances associated with each inductor by scaling the internal impedance of the filter; and matching the input and output of the filter with a passive network to the desired external impedance.

In an advantageous embodiment, the passive matching network is a L-network.

In another advantageous embodiment, the passive matching network is a Π-network.

In another advantageous embodiment, the passive matching network is a T-network.

In another advantageous embodiment, the passive matching network consists of multiple cascaded L-networks.

In an advantageous embodiment, the passive matching network is optionally merged with front and tail inductors of the internal filter.

In an advantageous embodiment, the desired filter is a low-pass filter.

In another advantageous embodiment, a smaller physical arrangement can be achieved where capacitances are interleaved in stacked layers.

Using an embodiment according to the invention, some or all of the advantages discussed above can be obtained. Alternatively, or in addition, a reduced size can be achieved if the structure described with reference to FIGS. 5a, 5b and 5c is used. For example, two filters can be implemented in approximately 1.5 times the area needed for the implementation of a single filter.

To further summarize, embodiments according to the invention create an impedance scaled low-pass filter. A filter structure according to an embodiment of the invention can be designed on the basis of a standard semi-lumped low-pass filter, which is a very well known solution. The design of such a standard semi-lumped low-pass filter is described, for example, in the book "Electronic Filter Design and Simulation" by Giovanni Bianchi and Roberto Sorrentino (McGraw-Hill May 2007, section 5.1) and the associated references. Some embodiments according to the invention solve the problem that the parasitic shunt impedance associated with the series inductors degrades the stop-band response of the filter. Accordingly, embodiments according to the invention bring along a wide number of advantages. For example, embodiments according to the invention allow the realization of smaller filters with better stop-band performances (wider clean stop-band with higher rejection). Moreover, an exemplary implementation of the invention itself permits to pack two filters in the size of 1.5 filters, with a further reduction of the size.

8. Implementation Alternatives

It should be noted that the above described filter structure can be varied over a wide range. For example, embodiments according to the invention are not limited to low-pass filter structures. Rather, it is possible to implement bandpass filter structures or high-pass filter structures. Also, the embodiments according to the invention are not limited to a certain filter order. Rather, filters of different orders can be designed, as it is well known to a man skilled in the art. Also, different filter types may be desired, like, for example, Chebyshev filters, Butterworth filters, Cauer filters, and so on. It should also be noted that the conducting layers can be implemented using a wide variety of materials like, for example, copper, aluminum, gold, and so on. Also, the dielectric layers may be implemented using different materials which are well known to a man skilled in the art. Also, the dielectric constant of the dielectric layers may vary, for example between 1.5 and 100, wherein different choices are also possible. The thickness of the layers may also vary, for example, between 1 μm and 1 cm.

While these inventions have been described in terms of several embodiments, there are alterations, permutations, and equivalents which fall within the scope of the inventions. It should also be noted that there are many alternative ways of implementing the methods and compositions of the present inventions. It is therefore intended that the following appended claims be interpreted as including all such alterations, permutations and equivalents as fall within the true spirit and scope of the present inventions.

The invention claimed is:

1. An electrical filter for forwarding an electrical signal from a first port to a second port in a frequency-selective manner, the filter comprising:
   the first port comprising a first characteristic port impedance;
   the second port comprising a second characteristic port impedance;
   a filter core comprising a working impedance, wherein the working impedance is different from the first characteristic port impedance and from the second characteristic port impedance, wherein the filter core comprises a first filter core port, a second filter core port, a plurality of series impedance elements electrically coupled between the first filter core port and the second filter core port, and a plurality of shunt impedance elements, wherein the shunt impedance elements of the filter core are implemented using transmission lines electrically coupled to nodes which are electrically coupled between subsequent series impedance elements of the first filter core, wherein the shunt impedance elements of the first filter core are arranged in different conducting layers of a multi-layer structure, and wherein a transmission line used to implement a first shunt impedance element does not overlap a transmission line used to implement a second impedance element in a projection perpendicular to a main surface of the multi-layer structure;
   a first matching circuit electrically coupled between the first port and the filter core, wherein the first matching circuit is configured to perform an impedance matching between the first characteristic port impedance and a characteristic impedance presented by the filter core to the first matching circuit; and
   a second matching circuit electrically coupled between the second port and the filter core, wherein the second matching circuit is configured to perform an impedance matching between the second characteristic port impedance and a characteristic impedance presented by the filter core to the second matching circuit.

2. The filter according to claim 1, wherein the working impedance of the filter core is smaller than the first characteristic port impedance; and
   wherein the working impedance of the filter core is smaller than the second characteristic port impedance.

3. The filter according to claim 1, wherein the filter core comprises a plurality of inductances implemented using transmission lines comprising transmission line impedances higher than the working impedance.

4. The filter according to claim 1, wherein the filter core comprises a plurality of capacitances implemented using transmission lines comprising transmission line impedances smaller than the working impedance.

5. The filter according to claim 1, wherein the first characteristic port impedance is equal to the second characteristic port impedance; and
   wherein the characteristic impedance presented by the filter core to the first matching circuit is analogous to the characteristic impedance presented by the filter core to the second matching circuit.

6. The filter according to claim 1, wherein the first matching circuit or the second matching circuit is a L-network comprising a shunt impedance element and a series impedance element.

7. The filter according to claim 6, wherein the first matching circuit comprises a shunt capacitance and a series inductance, wherein the series inductance of the first matching circuit is merged with a front inductance of the filter core.

8. The filter according to claim 6, wherein the first matching circuit comprises a shunt capacitance and a series inductance, wherein the second matching circuit comprises a shunt capacitance and a series inductance, wherein the series inductance of the second matching circuit is merged with a tail inductance of the filter core.

9. The filter according to claim 1, wherein the first matching circuit or the second matching circuit is a Π network comprising at least two shunt impedance elements and a series impedance element electrically coupled between the shunt impedance elements.

10. The filter according to claim 1, wherein the first matching circuit or the second matching circuit is a T network comprising at least two series impedance elements and a shunt impedance element electrically coupled with a node which is electrically coupled between the two series impedance elements.

11. The filter according to claim 1, wherein the first matching circuit or the second matching circuit comprises a plurality of cascaded L-networks.

12. The filter according to claim 1, wherein the filter core is configured to form a low pass filter, and
   wherein the filter core comprises a plurality of series inductances electrically coupled in series between a first end of the filter core, which is electrically coupled to the first matching circuit, and a second end of the filter core, which is electrically coupled to the second matching circuit,
   wherein the series inductances of the filter core are implemented using transmission lines comprising a transmission line impedance which is higher than the working impedance.

13. The filter according to claim 12, wherein the series inductances of the filter core are implemented using strip lines comprising a conductive strip arranged between two ground layers.

14. A double filter, comprising:
   a first filter comprising a first filter core;
   a second filter comprising a second filter core;
   wherein the first filter core comprises a first filter core port, a second filter core port, a plurality of series impedance elements electrically coupled between the first filter core port and the second filter core port, and a plurality of shunt impedance elements, wherein the shunt impedance elements of the first filter core are implemented using transmission lines electrically coupled to nodes which are electrically coupled between subsequent series impedance elements of the first filter core, wherein the shunt impedance elements of the first filter core are arranged in different conducting layers of a multi-layer structure; and
   wherein the second filter core comprises a third filter core port, a fourth filter core port, a plurality of series impedance elements electrically coupled between the third filter core port and the fourth filter core port, and a plurality of shunt impedance elements, wherein the shunt impedance elements of the second filter core are implemented using transmission lines electrically coupled to nodes which are electrically coupled between subsequent series impedance elements of the second filter core, wherein the shunt impedance elements of the second filter core are arranged in different conducting layers of the multi-layer structure, and wherein a transmission line used to implement a first shunt impedance element of the first filter core and a transmission line used to implement a second shunt impedance element of the second filter core are arranged in a common conducting layer of the multi-layer structure.

15. The double filter according to claim 14, wherein a transmission line used to implement a second shunt impedance element of the first filter core and a transmission line used to implement a first shunt impedance element of the second filter core are arranged in a common conducting layer of the multi-layer structure.

16. The double filter according to claim 14, wherein the transmission line used to implement the first shunt impedance element of the first filter core and the transmission line used to implement the first shunt impedance element of the second filter core are at least partly overlapping in a projection perpendicular to a main surface of the multi-layer structure, with a conductive shielding disposed in between.

17. The double filter according to claim 15, wherein the transmission line used to implement the second shunt impedance element of the second filter core and the transmission line used to implement the second shunt impedance element of the first filter core are at least partly overlapping in a projection perpendicular to the main surface of the multi-layer structure, with a conductive shielding disposed in between.

18. The double filter according to claim 14, wherein the shunt impedance elements of the first filter core are arranged in different conducting layers of the multi-layer structure, such that a via inductance is arranged in series with at least one of the shunt impedance elements of the first filter core; and wherein the shunt impedance elements of the second filter core are arranged in different conducting layers of the multi-layer structure, such that a via inductance is arranged in series with at least one of the shunt impedance elements of the second filter core.

* * * * *